United States Patent
Iyer

(10) Patent No.: US 12,420,225 B2
(45) Date of Patent: Sep. 23, 2025

(54) MANIFOLD ASSEMBLY FOR TRAP FILTER SYSTEMS

(71) Applicant: Intel Corporation, Santa Clara, CA (US)

(72) Inventor: Subramani Iyer, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 836 days.

(21) Appl. No.: 17/557,049

(22) Filed: Dec. 21, 2021

(65) Prior Publication Data

US 2022/0111324 A1 Apr. 14, 2022

(51) Int. Cl.
B01D 46/00 (2022.01)
C23C 16/44 (2006.01)

(52) U.S. Cl.
CPC ..... *B01D 46/0087* (2013.01); *B01D 46/0005* (2013.01); *B01D 46/0039* (2013.01); *B01D 46/0086* (2013.01); *B01D 2258/0216* (2013.01); *C23C 16/4412* (2013.01)

(58) Field of Classification Search
CPC ........ C23C 16/4412; B01D 2258/0216; B01D 53/06; B01D 46/0087; B01D 46/58; B01D 46/90
See application file for complete search history.

(56) References Cited

U.S. PATENT DOCUMENTS

| | | |
|---|---|---|
| H1701 H | 1/1998 | DePinto et al. |
| 6,332,925 B1 | 12/2001 | Noji et al. |
| 6,896,764 B2 | 5/2005 | Kitazawa |
| 7,896,959 B1 * | 3/2011 | Schopf, Jr. ............. B01D 46/10 |
| 11,529,581 B2 * | 12/2022 | Kurihara ................ B01D 46/58 |
| 2003/0141016 A1 * | 7/2003 | Okase ................... B08B 7/0035 |
| | | 118/715 |
| 2005/0056148 A1 * | 3/2005 | Sweeney ............ B01D 53/0415 |
| | | 96/132 |
| 2008/0280750 A1 * | 11/2008 | Liu ...................... B01J 37/0063 |
| | | 502/352 |

(Continued)

FOREIGN PATENT DOCUMENTS

CN 108854331 A * 11/2018 ......... B01D 46/0058

OTHER PUBLICATIONS

Jung-Nan Hsu et al., "Silane Removal at Ambient Temperature by Using Alumina-Supported Metal Oxide Adsorbents", Journal of the Air & Waste Management Association, Feb. 2007, pp. 204-210, vol. 57.

(Continued)

*Primary Examiner* — Robert Clemente
(74) *Attorney, Agent, or Firm* — Viering, Jentschura & Partner mbB

(57) ABSTRACT

The present disclosure is directed to a manifold assembly for a trap filter system having an inlet for receiving a flow of gas effluents containing contaminants generated by a semiconductor processing tool, a housing for a plurality of filters, wherein the plurality of trap filters connected to the inlet and are interchangeable while the semiconductor processing tool remains in operation, and a bypass mechanism configured to selectively direct or shut off the flow of gas effluent to one or more of the plurality of trap filters, wherein each of the plurality of filter is removable and replaceable when the filter is unable to effectuate the removal of contaminants.

17 Claims, 7 Drawing Sheets

(56) References Cited

U.S. PATENT DOCUMENTS

| | | | |
|---|---|---|---|
| 2009/0025565 A1* | 1/2009 | Cho | B01D 46/4272 96/393 |
| 2009/0078123 A1* | 3/2009 | Engerran | C23C 16/4486 55/392.1 |
| 2014/0263085 A1* | 9/2014 | Mitchell | B01D 46/90 210/791 |
| 2022/0111324 A1 | 4/2022 | Iyer | |
| 2022/0112598 A1* | 4/2022 | Iyer | C23C 16/4412 |

OTHER PUBLICATIONS

Peter L. Timms, "The chemistry of volatile waste from silicon wafer processing", Journal of the Chemical Society, Dalton Transactions, Jan. 1, 1999, pp. 815-822.

U.S. Non-Final Office Action of corresponding U.S. Appl. No. 17/557,051, dated Aug. 16, 2023 (for informational purposes only).

U.S. Final Office Action of corresponding U.S. Appl. No. 17/557,051, dated Apr. 18, 2024 (for informational purposes only).

\* cited by examiner

MANIFOLD ASSEMBLY FOR TRAP FILTER SYSTEMS

BACKGROUND

Typical semiconductor processes will produce exhaust gases when, for example, depositing and etching the various materials needed to manufacture semiconductors. There may be unreacted gases, reactive radical species, and/or corrosive gases, among other things, present as effluents emitted under vacuum through the exhaust port of a semiconductor processing tool that may be transported into a pump/abatement system. The reactive species, polymer residues, and byproducts, as well as particles, may clog and damage the pump/abatement system and may result in tool downtime, repair, replacement costs and an increase in the cost of operations. For the semiconductor manufacturing industry, there is a continuous focus on increasing process yields, wafer throughput, and tool uptime.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1:
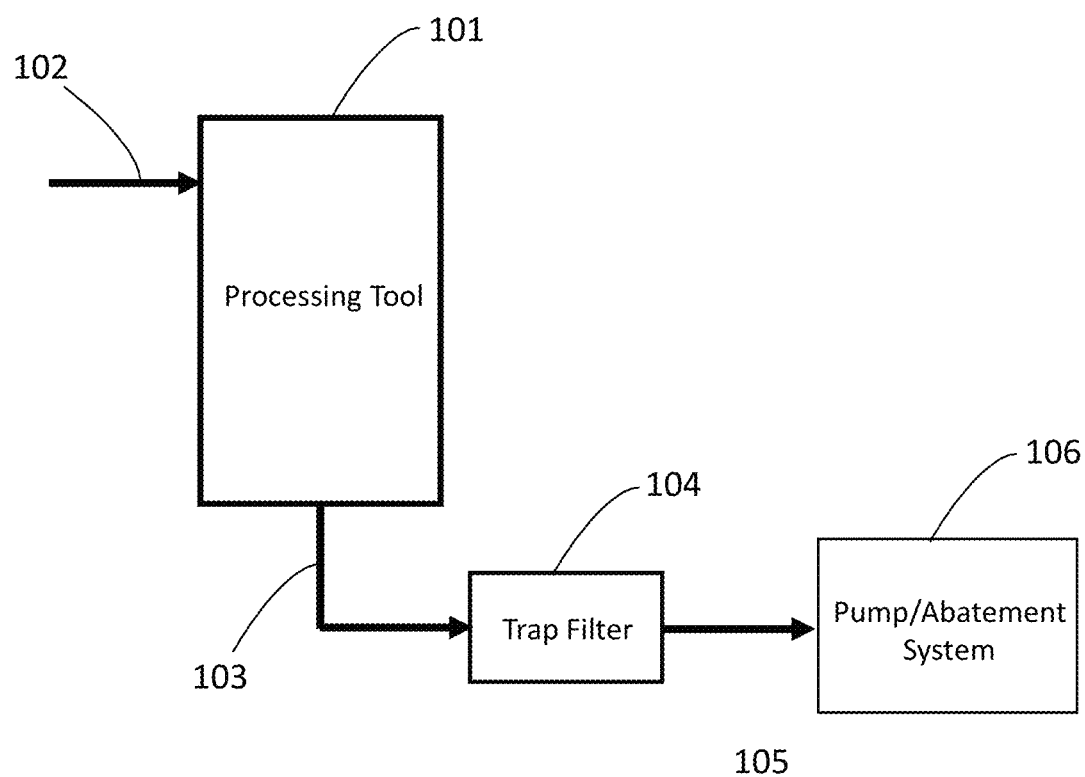
FIG. 1 shows a trap filter system with a manifold assembly provided downstream from a semiconductor processing tool according to an aspect of the present disclosure.

The following detailed description refers to the accompanying drawings that show, by way of illustration, specific details, and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure generally relates to a trap filter system with a manifold assembly having a plurality of filters. In an aspect, the present disclosure may have a manifold assembly and a bypass mechanism that permits easy interchange and the ability to swap out and/or alternate filters; in particular, the "hot-swapping" of used/exhausted filters without impacting/stopping production.

The present disclosure is also directed a trap filter system that allows the use of "cold traps" or room temperature filtering for semiconductor manufacturing processes to trap effluents/unreactive chemicals and particles. Semiconductor fabs may not use chemical/cold traps, primarily due to the complexity of handling the chemicals once trapped. According to the present disclosure, the cold traps may be most effective when used with condensing gas species and may be able to address a full spectrum of reactive species and solids.

The present disclosure is further directed a manifold assembly that allows ease of swapping of a used/exhausted filter with a new filter, including using a mechanical "revolver-like" rotation. In an aspect, the manifold assembly may have a housing with the various subcomponents and that can accommodate a plurality of filters, e.g., at least two filters, that is designed to allow the filters to be rotated in and out of alignment with an exhaust line of a semiconductor processing tool. This arrangement allows a used filter to be replaced while the semiconductor processing tool continues to operate with little or no interruption.

In an aspect, the present disclosure may have a plurality of filters that permit a parallel gas flow, which may be directed, or re-directed, as needed by a bypass mechanism or a manifold assembly with a bypass mechanism in the event the effluents clog up one of the filters.

The present disclosure is also directed to a physical filter in combination with a reactive matrix to trap the gas contaminants and solids so that downstream pump and/or abatement systems are protected from contaminants in the gas effluents to maintain their efficiency. The present filters may contain a passive matrix to enable the physical trapping of solids and a reactive matrix to enable chemical reaction/quenching to stop reactive chemicals from damaging the pump and abatement systems.

In an aspect, the present disclosure is directed to effecting chemical reactions between the exhaust gases and the chemical trapping reagents in a reactive matrix at room temperature. The present trapping filter/matrix materials may include a mixture of activated carbon or alumina, zeolites as a support, with a nano mixed-metal oxide having a large surface area and porosity.

In another aspect, the present filter materials may be customized and "targeted" to address the various particles and chemicals in an effluent with a high degree of specificity. In the present disclosure, the filtering of particulates and the chemical filtration may use, respectively, different filter/matrix materials. In an aspect, the present disclosure may provide a customized matrix with several filter materials used to address the specific effluents that need to be captured. In addition, the filter matrix materials may be "stacked" to address different types of gas effluents and the contaminants therein, e.g., a combination of a first filter material to remove particles, a second filter material to remove a first gas, a third filter material to remove a second gas, etc.

In yet another aspect, the present filter materials may convert reactive gas species in an effluent gas into inert and unreactive species before flowing into and through pump/abatement systems. In addition, for certain gas species, the use of elevated temperature, by providing heating elements for the present trap filtering system, which may improve the conversion of reactive gas species to inert/unreactive species.

In an additional aspect of the present disclosure, the filters may be designed for reuse by having filter materials that be re-generated or replaced to allow the present trap filter system to be more environmentally friendly. For example, if a metal matrix filter is used, it can be regenerated back into native species using reductive gases; similarly, other matrix materials which form reversible compounds upon reaction with effluents can also be regenerated, several metals such as Ni, Pd, etc. can be used.

In a further aspect, the present disclosure may have a filter housing design that accommodates a specific flow rate for gas effluents and the amount of time the contaminants may need to be present in a filter to be captured, i.e., residence time. On the other hand, the filter housing design may need to provide a high level of flow or conductance in providing a path for gas effluents. In this regard, a filter housing design and the type/structure of the filter materials may need to be optimized to provide a designated flow rate for the present trap filter system.

An advantage of the present disclosure may include, but is not limited to, reducing the annual cost for refurbishing, cleaning, and repair of pumps and abatement systems for process chambers. In an aspect, the present trap filter system may reduce costs by approximately 80% by protecting the pump and abatement systems.

To more readily understand and put into practical effect, the present trap filter system with a manifold assembly, particular aspects will now be described by way of examples that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

In FIG. 1, according to an aspect of the present disclosure, a semiconductor processing tool 101 may have processing gas inlet 102 and gas effluent/exhaust outlet 103. Depending on the type of semiconductor processing tool and the operation or process step in the manufacturing of a semiconductor device, there will be different processing gases used and by-product gases and contaminants generated by the process step. In an aspect, the semiconductor processing tool may include deposition tools (e.g., thermal/plasma chemical vapor deposition, atomic layer deposition, epitaxial film deposition, etc.), and other semiconductor processing tools that generate exhaust gases containing contaminants.

Figure 2:
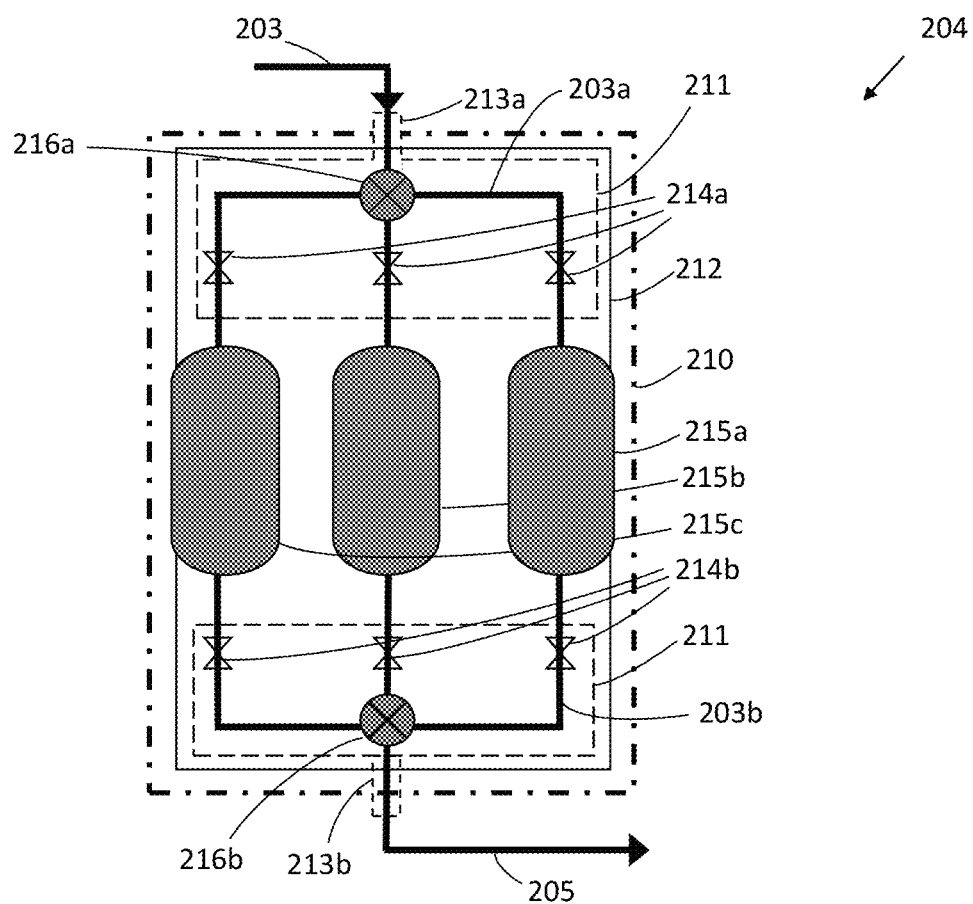
FIG. 2 shows a schematic view of a trap filter system with a manifold assembly according to another aspect of the present disclosure.

In addition, FIG. 1 shows a trap filter system 104 with a manifold assembly (as shown in FIG. 2) that may be provided downstream from and connected to the outlet 103 of the semiconductor processing tool 101. In an aspect, the trap filter system 104 may be incorporated as a subcomponent of the semiconductor processing tool 101 (not shown). In another aspect, the trap filter system 104 may be positioned upstream from and connected via a gas conduit 105 to a pump or abatement system 106, according to an aspect of the present disclosure, as a new installation or a retrofit for existing fab operations.

In an aspect, the present trap filter system may be a cost-effective substitute for an abatement system or provide a point-of-use (POU) pre-treatment of the effluent gases. An abatement system may be used for exhaust gas handling and treatment from various semiconductor manufacturing processes and tools. The abatement system may have numerous inlets feeding into a single common treatment system or be a POU abatement system handling gases from a single semiconductor processing tool. Abatement systems may include "washing" of the exhaust gases by combustion/burning, catalytic treatment, oxidative treatment, dry and/or wet scrubbing, and other gas treatment methods.

In another aspect, the present filter trap system may be designed to be positioned upstream from a pumping system, which may be a 'roughing' pump that creates a vacuum to direct exhaust gases into an abatement system. It is within the scope of the present disclosure to have the present filter trap system integrated into the pumping system or the abatement system.

In FIG. 2, a schematic view of a trap filter system 204 with a manifold assembly 211 (shown as dashed lines) is provided connected to an exhaust outlet 203, according to another aspect of the present disclosure. In this aspect, the trap filter system 204 may have an enclosing member 210 (shown as dashed lines) and the manifold assembly 211 that may have a housing member 212 with manifold inlet 213a and manifold outlet 213b. In addition, the manifold assembly 211 may have various subcomponents, including exhaust fore lines 203a, front-end bypass mechanism 216a, and fore line shutoff valves 214a, and exhaust backlines 203b, back-end bypass mechanism 216b, and back-end shutoff valves 214b. In this aspect, exhaust fore lines 203a may be connected, respectively, to a plurality of filters 215a, 215b, and 215c, which are configured in a parallel orientation, and thereafter, the plurality of filters may be connected to the exhaust backlines 203b, which lead to a gas conduit 205.

In an aspect, it should be understood that the trap filter system 204 will maintain the operating pressure or vacuum level of a semiconductor processing tool to which it is connected, e.g., the use of an appropriate housing, valves, seals, and/or connectors to maintain the vacuum.

According to the present disclosure, an effluent gas generated by a semiconductor processing tool (not shown) may flow through the exhaust outlet 203 into the manifold inlet 213a to the front-end bypass mechanism 216a, which may route the effluent gas through the exhaust fore lines 203a to one of the plurality of filters, for example, filter 215a, to remove particulate and chemical contaminants from the effluent gas. When the filter 215a is "exhausted" and no longer able to effectuate the removal of the particle and/or chemical contaminants from the effluent gas generated by the semiconductor processing tool, the filter 215a may be "bypassed" or swapped out, and replaced by the filter 215b. Similarly, in an aspect where the filter 215b is exhausted, it may be replaced by the filter 215c.

In another aspect, according to the present disclosure, the present filters may be configured as a removable sealed cartridge that may be replaced as a "plug and play" unit, and alternatively, as an accessible casing containing filter materials therein as one or more replaceable inserts.

In a further aspect, the present manifold assembly 211 may be configured for a "passive" or an "active" modality. In the passive modality, a filter 215 may be replaced based on a schedule and the front-end and back-end bypass mechanisms 216a, 216b and the fore line and backline shutoff valves 214a, 214b may be manually set to shut off and divert the flow of exhaust gas from one to the other of the plurality of filters 215. In the active modality, a filter 215 may be replaced based on a measured or monitored flow rate, e.g., front-end pressure vs back-end pressure, determined by a manifold controller (not shown) and the front-end and back-end bypass mechanisms 216a, 216b, and the fore line and backline shutoff valves 214a, 214b may be electronically controlled with actuators (not shown) to shut off and divert the flow of exhaust gas from one to the other of the plurality of filters 215. In an aspect, the bypass mechanisms may include a sensor (not shown) for monitoring the flow rate of the gas effluent, which may be triggered upon reaching certain predefined pressure conditions to activate the bypass mechanisms.

Figure 3:
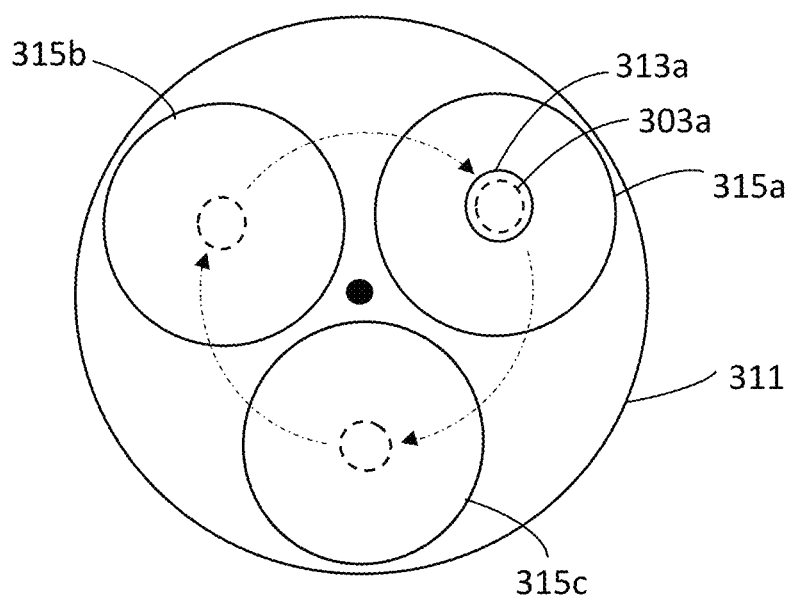
FIG. 3 shows a schematic top view of a manifold assembly according to yet another aspect of the present disclosure.

FIG. 3 shows a top view of a manifold assembly 311 according to yet another aspect of the present disclosure. In this aspect, the manifold assembly 311 may be able to revolve, while being able to accommodate three filters 315a, 315b, and 315c. When the present trap filter system is operational, for example, a manifold inlet 313a may be aligned and connected with filter 315a via an exhaust fore line 303a. In this aspect, the manifold assembly 311 may be rotated to replace a used filter 315a with an unused filter 315b; thereafter, a used filter 315b may be replaced with an unused filter 315c. It is within the scope of the present disclosure to have the rotation of the manifold assembly 311 be performed manually, in a passive modality, or by a drive mechanism (not shown), in an active modality.

Figure 4:
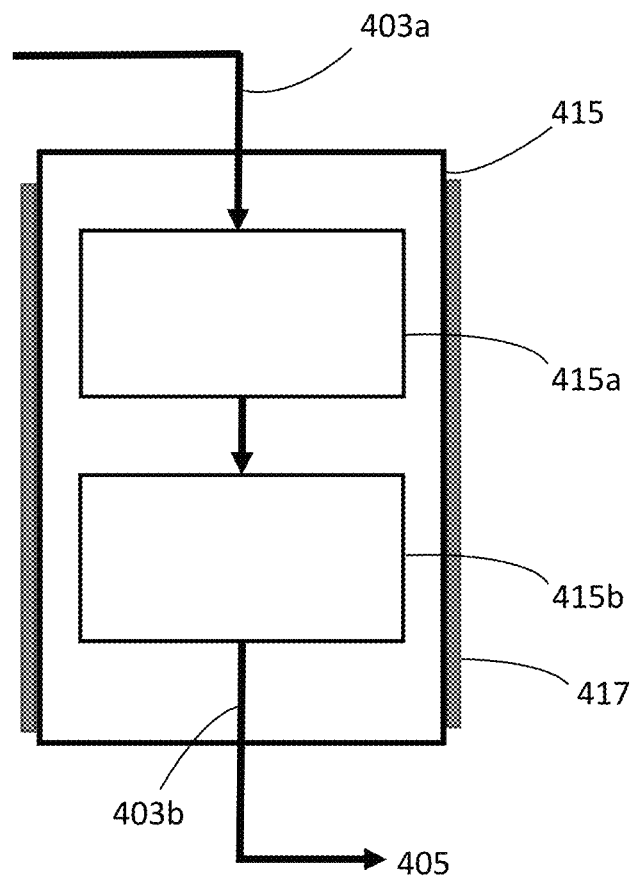
FIG. 4 shows a schematic view of a filter for a trap filter system with a manifold assembly according to yet another aspect of the present disclosure.

In FIG. 4, a representative filter for a trap filter system is shown, according to yet another aspect of the present disclosure. In this aspect, an exhaust fore line 403a may provide a gas effluent to filter 415, which has a first filter material 415a and a second filter material 415b. The first and second filter materials 415a and 415b may be positioned sequentially, as shown in FIG. 4, or as a plurality of alternating layers of the first and second materials, as well as other different configurations, such as an annular structure. The present trap filter materials may include a mixture of activated carbon, alumina, or zeolite as a support, with a nano mixed-metal oxide having a large surface area and porosity; such filter materials may include, for example, metal-rich Cu-, Zn-, Ni-, Ti-, Zr-, Hf-, etc. based metal-organic framework (MOF). These MOFs may have surface areas that typically range from 1000 to 10,000 $m^2/g$ to provide a large absorption capacity for the contaminants that may be present in the gas effluent.

In another aspect, the present filter materials may be customized to address the various particles and chemicals in an effluent with a high degree of specificity. It is within the scope of the present disclosure to have the first filter material directed to the removal of particulate contaminants and the second filter material directed to the removal of chemical contaminants and, alternatively, the first filter material directed to the removal of a first chemical contaminant and the second filter material directed to the removal of a second chemical contaminant.

In an aspect, for example, the first filter material may be a particle filter made with an unreactive physical filtering media, such as alumina, zeolite, carbon, and molecular sieve materials, and the second filter material 415b may be a reactive filter material made with a support nano-material with high porosity, such as activated metal, cellulose, hydrated alumino silicates, functionalized polymeric membrane, and metal oxide frameworks, and active metal-oxide adsorbents, such as $ZnO/Al_2O_3$, $CeO_2/Al_2O_3$, $CuO/Al_2O_3$, $CuO—CeO_2/Al_2O_3$, and $CuO—ZnO/Al_2O_3$ and/or other specific functionalied materials designed to chemically interact with the effluent gases.

In yet another aspect, according to the present disclosure, the present filter may be configured as a removable sealed cartridge that may be replaced in a "plug and play" unit and, alternatively, as an accessible casing containing the filter materials therein as one or more replaceable inserts. In any event, the present filters must be able replaceable while being able to maintain the pressure level or vacuum of the production line.

According to the present disclosure, a trap filter system may have a heating element to provide an elevated temperature that may be needed to improve the conversion of certain reactive gas species to inert/unreactive species and/or the adsorption of such species by a filter material. As shown in FIG. 4, the filter 415 may have a heating element 417 configured as an exterior sleeve for providing heat to the first and second filter materials 415a and 415b. The heating element 417 may be configured as needed, for example, based on the shape of the plurality of filters. In an aspect, it is within the scope of the present disclosure to provide an inductive heating element as the source of heat; the filter materials may be provided with a metal mesh envelop that may be heated. In another aspect, heat may be simultaneously applied to all the filters by having a heating element as part of a manifold assembly that encloses the plurality of filters.

Figure 5:
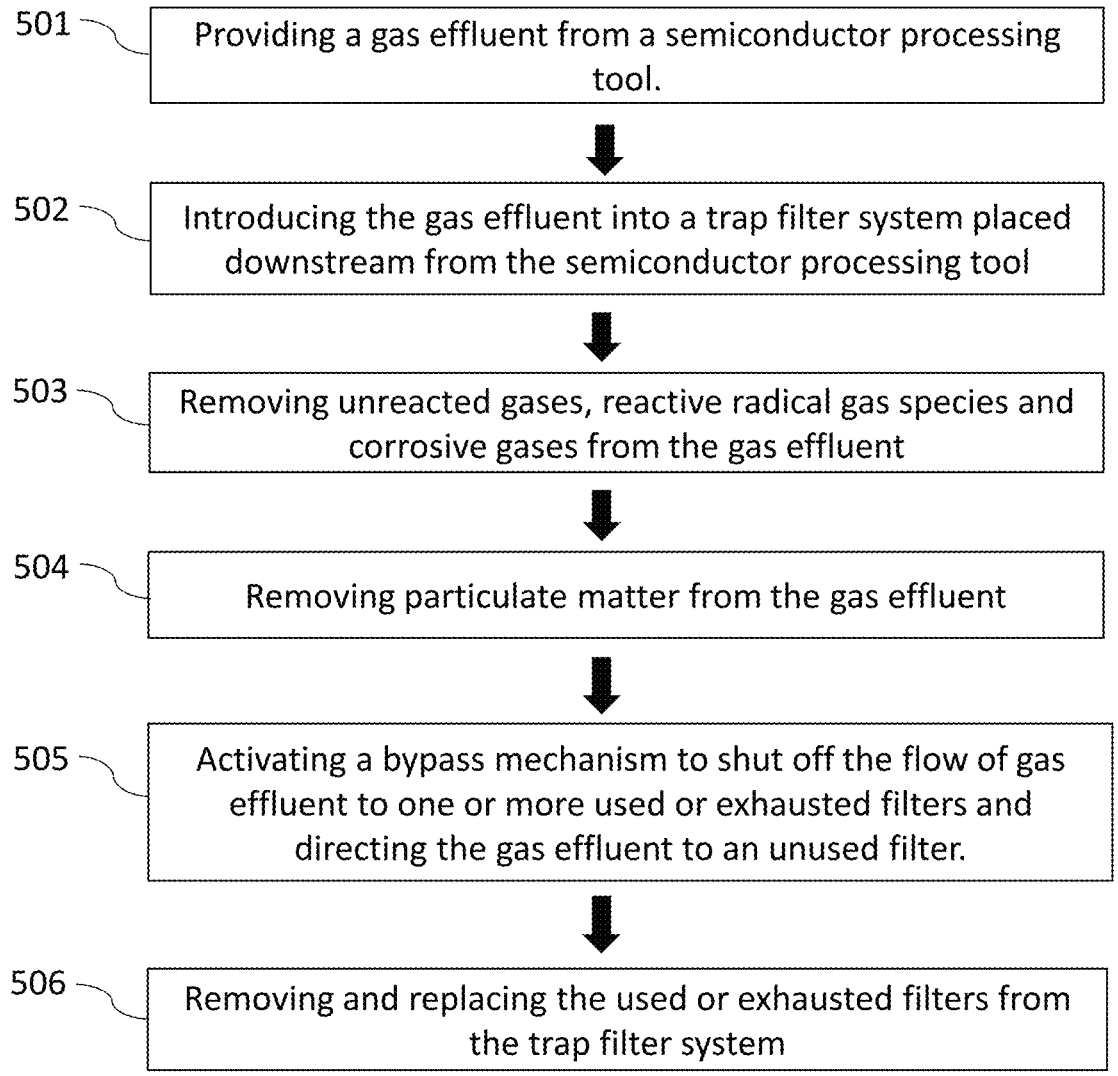
FIG. 5 shows a simplified flow diagram for an exemplary method according to an aspect of the present disclosure.

FIG. 5 shows a simplified flow diagram for an exemplary method for removing contaminants from a gas effluent generated by a semiconductor processing tool according to an aspect of the present trap filter system.

The operation 501 may be directed to providing a gas effluent from a semiconductor processing tool.

The operation 502 may be directed to introducing the gas effluent into a trap filter system placed downstream from the semiconductor processing tool. In addition, the trap filter may be upstream from a pump/abatement system.

The operation 503 may be directed to removing unreacted gases, reactive radical gas species, and corrosive gases from the gas effluent.

The operation 504 may be directed to removing particulate matter from the gas effluent.

The operation 505 may be directed to activating a bypass mechanism to shut off the flow of gas effluent to one or more used or exhausted filters. In addition, the gas effluent may be directed to an unused filter thereafter.

The operation 506 may be directed to removing and replacing the used or exhausted filters from the trap filter system.

The methods presented above are intended to be exemplary for using the present trap filter system. It will be apparent to those ordinary skilled practitioners that the foregoing process operations may be modified without departing from the spirit of the present disclosure.

Figure 6:
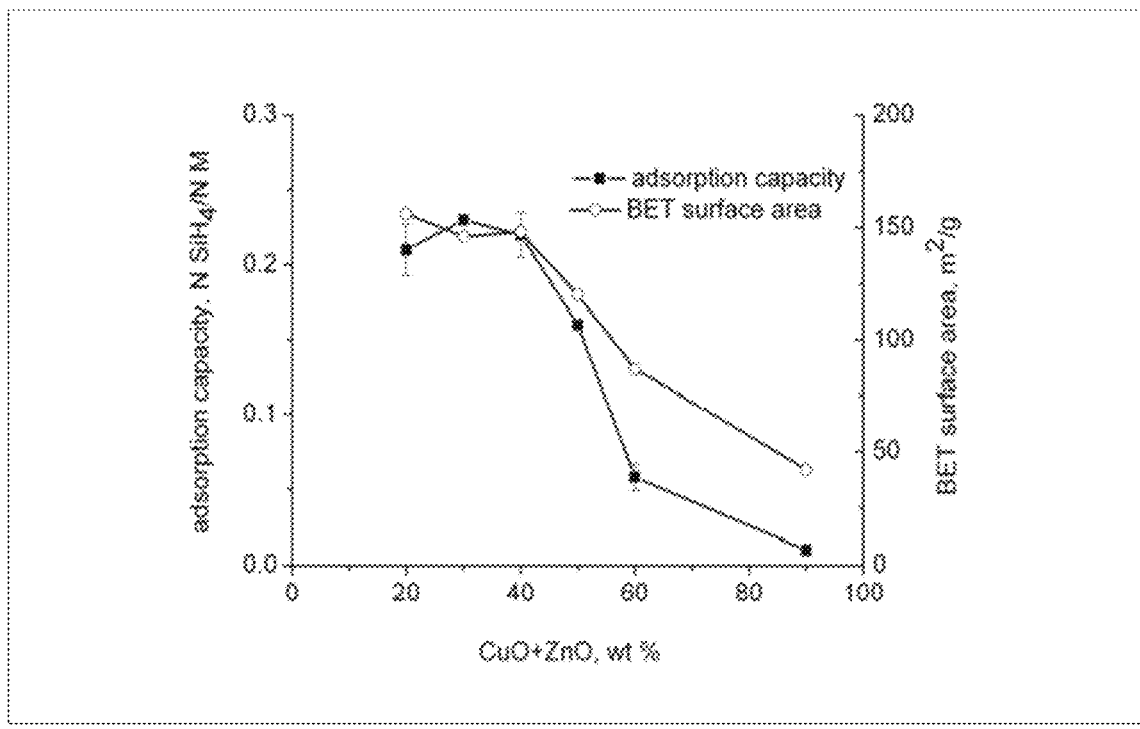
FIG. 6 shows illustrative data for a trap filter system with a manifold assembly according to an aspect of the present disclosure.
Figure 7:
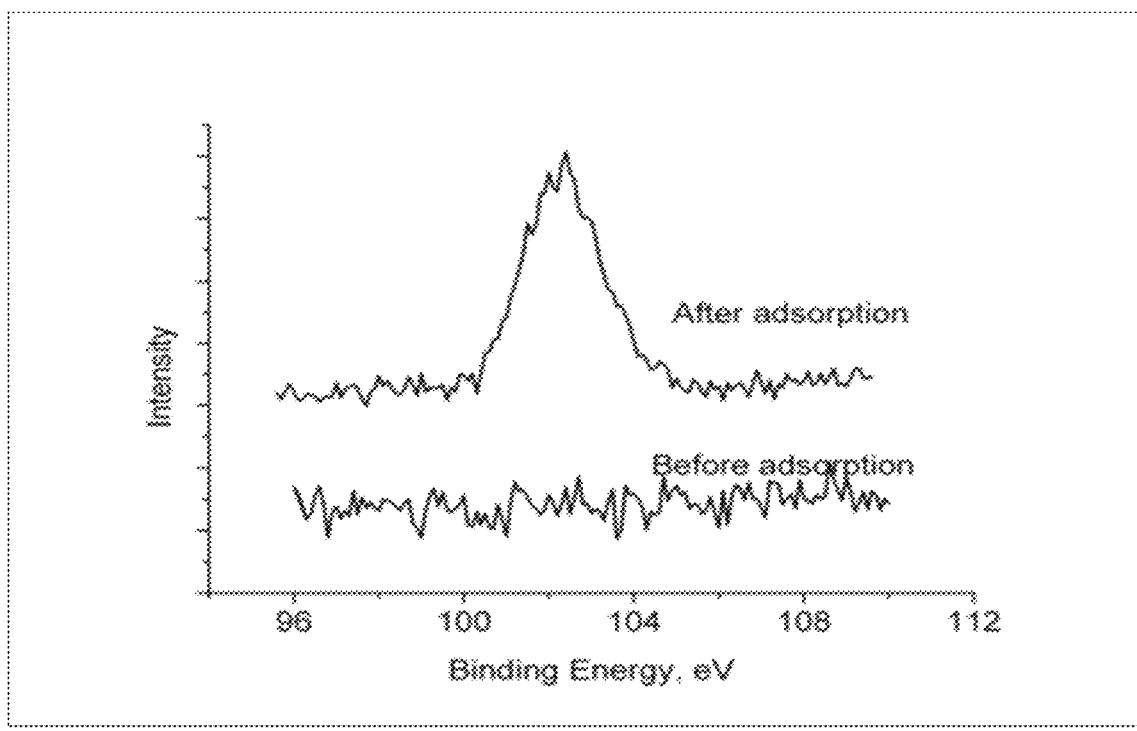
FIG. 7 shows further illustrative data for a trap filter system with a manifold assembly according to a further aspect of the present disclosure.

FIGS. 6 and 7 show illustrative data for a present trap filter system with a manifold assembly according to an aspect of the present disclosure. In an aspect, the present adsorbents may be binary/ternary mixed metal oxides having high surface areas and dispersed throughout a support material. The amount of the active metal oxides may be optimized to demonstrate the necessary adsorption capacity for a specific gas effluent generated by a specific semiconductor processing tool.

According to an aspect of the present disclosure, the present filter materials that may be used to remove silane and its radicals may include a support nano-material with high porosity, for example, alumina, zeolite, and carbon (e.g., graphene, carbon nanotubes, etc.) and active metal oxide adsorbents, for example, $ZnO/Al_2O_3$, $CeO_2/Al_2O_3$, $CuO/Al_2O_3$, $CuO—CeO_2/Al_2O_3$, and $CuO—ZnO/Al_2O_3$.

In another aspect, the present disclosure may be based on the following reaction chemistry for the adsorption of silane ($SiH_4$) by $CuO—ZnO/Al_2O_3$:

$$SiH_4 + 2CuO \rightarrow Si + 2Cu + 2H_2O$$

and when the adsorbent is exposed to air:

$$Si + x/2 O_2 \rightarrow SiOx$$

$$2Cu + O_2 \rightarrow 2CuO$$

The above reactions indicate that $SiH_4$ and its radicals may be removed from an exhaust gas by reduction to Si with the active species (CuO) of the adsorbents, according to present disclosure directed to a trap filter system with a manifold assembly. When the present adsorbent is exposed to air, the Si oxidizes to SiOx and the reduced Cu oxidizes into CuO in air.

As shown in FIG. 6, there is a relationship between the adsorption capacity of silane ($SiH_4$) and the various weight percentages of CuO+ZnO used in a filter material. It appears that the adsorption capacity may be greater for weight percentages that are under forty percent (40%). In addition, as shown in FIG. 7, the X-ray photoelectron spectroscopy (XPS) studies of the samples used in FIG. 6 show the $Si_2p$ peaks before and after adsorption, which supports the usage of the filter materials according to the present disclosure.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

To more readily understand and put into practical effect the present manifold assembly and methods, they will now be described by way of examples. For the sake of brevity, duplicate descriptions of features and properties may be omitted.

EXAMPLES

Example 1 provides a manifold assembly including an inlet for receiving a flow of gas effluents containing contaminants generated by a semiconductor processing tool, a housing for a plurality of filters, for which the plurality of trap filters are connected to the inlet and are interchangeable while the semiconductor processing tool remains in operation, and a bypass mechanism configured to selectively direct or shut off the flow of gas effluent to one or more of the plurality of trap filters, for which each of the plurality of filters is removable and replaceable when the filter is unable to effectuate the removal of contaminants.

Example 2 may include the manifold assembly of example 1 and/or any other example disclosed herein, for which the housing further includes a rotating structure for aligning the filters with the inlet to receive gas effluents from the semiconductor processing tool.

Example 3 may include the manifold assembly of example 2 and/or any other example disclosed herein, further including positioning the manifold assembly on an exhaust line for the semiconductor processing tool upstream from a pump or abatement system.

Example 4 may include the manifold assembly of example 1 and/or any other example disclosed herein, further including the plurality of filters being connected in parallel to receive the flow of gas effluent.

Example 5 may include the manifold assembly of example 1 and/or any other example disclosed herein, for which the plurality of filters further includes at least two filtering materials for removing particulate and/or chemical contaminants.

Example 6 may include the manifold assembly of example 5 and/or any other example disclosed herein, for which one of the two filtering materials comprises a support material and a metal oxide adsorbent.

Example 7 may include the manifold assembly of example 6 and/or any other example disclosed herein, for which the filter material removes unreacted gases, reactive radical gas species, and corrosive gases from the gas effluents.

Example 8 may include the manifold assembly of example 7 and/or any other example disclosed herein, for which the filter material converts reactive species in the effluents into inert and unreactive species.

Example 9 provides a method including configuring a manifold assembly for a trap filter system to remove contaminants from gas effluents provided from an exhaust line of a semiconductor processing tool, the manifold assembly including a plurality of trap filters connected to an inlet for receiving gas effluents containing contaminants generated by a semiconductor processing tool, for which the trap filters are interchangeable while the semiconductor processing tool remains in operation, a housing for the plurality of filters, and a bypass mechanism configured to selectively direct or shut off a flow of gas effluent to one or more of the plurality of trap filters, and activating the bypass mechanism to shut off the flow of gas effluent to one or more of the plurality of filters, when the one or more of the plurality of filters are unable to effectuate the removal of contaminants, and direct the flow of gas effluents to another of the plurality of filters.

Example 10 may include the method of example 9 and/or any other example disclosed herein, further including monitoring the flow of gas through the plurality of filters, for which the monitoring determines when the plurality of filters need to be replaced.

Example 11 may include the method of example 9 and/or any other example disclosed herein, further including removing and replacing the one or more of the plurality of filters that are unable to effectuate the removal of contaminants.

Example 12 may include the method of example 9 and/or any other example disclosed herein, further including removing particles, unreacted gases, reactive species, and corrosive gases from the gas effluents.

Example 13 may include the method of example 12 and/or any other example disclosed herein, further including converting reactive species in the effluents into inert and unreactive species.

Example 14 may include the method of example 9 and/or any other example disclosed herein, further including positioning the plurality of filters on the exhaust line for the semiconductor processing tool upstream from a pump or abatement system.

Example 15 may include the method of example 9 and/or any other example disclosed herein, further including refurbishing or regenerating the removed filters for reuse.

Example 16 provides a semiconductor processing system including a semiconductor processing tool, for which the semiconductor processing tool generates exhaust gases with contaminants, a manifold assembly for a trap filter system including: a plurality of filters, the plurality of filters having filtering materials to remove contaminants from the exhaust gases generated by the semiconductor processing tool, for which the exhaust gases flow into at least one of the plurality of filters, and a bypass mechanism configured to selectively direct or shut off a flow of exhaust gas effluent to one or more of the plurality of filters as the semiconductor processing tool remains in operation, for which the bypass mechanism is activated to replace one or more of the plurality of filters when the one or more of the plurality of filters are unable to effectuate the removal of contaminants.

Example 17 may include the semiconductor processing system of example 16 and/or any other example disclosed herein, for which the housing further includes a rotating structure for aligning the filters with the inlet to receive gas effluents from the semiconductor processing tool.

Example 18 may include the semiconductor processing system of example 16 and/or any other example disclosed herein, further including the plurality of filters being connected in parallel to receive the flow of the exhaust gas.

Example 19 may include the semiconductor processing system of example 16 and/or any other example disclosed herein, for which the plurality of filters remove particles, unreacted gases, reactive species, and corrosive gases from the exhaust gas.

Example 20 may include the semiconductor processing system of example 16 and/or any other example disclosed herein, further including positioning the plurality of filters on the exhaust line for the semiconductor processing tool upstream from a pump or abatement system.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A manifold assembly comprising:
   an inlet for receiving a flow of gas effluent containing contaminants generated by a semiconductor processing tool;
   a housing for a plurality of trap filters, wherein the plurality of trap filters are connected to the inlet and are interchangeable while the semiconductor processing tool remains in operation; and
   a bypass mechanism configured to selectively direct or shut off the flow of gas effluent containing contaminants generated by the semiconductor processing tool to one or more of the plurality of trap filters, wherein each of the plurality of trap filters is removable and replaceable;
   wherein the bypass mechanism further comprises a front-end bypass mechanism and a back-end bypass mechanism;
   wherein each of the plurality of trap filters comprises a fore line shutoff valve, configured to receive the flow of gas effluent containing contaminants generated by the semiconductor processing tool, and a back-end shutoff valve, configured to output a flow of filtered gas effluent;
   wherein the front-end bypass mechanism is located between the inlet of the manifold assembly and the fore line shutoff valve of each of the plurality of trap filters;
   wherein the front-end bypass mechanism is configured to selectively shut off or divert the flow of gas effluent containing contaminants from the inlet of the manifold assembly to one or more of the plurality of trap filters; and
   wherein the back-end bypass mechanism is located downstream of the back-end shutoff valve of each of the plurality of trap filters and is configured to selectively shut off or divert the flow of filtered gas effluent to the back-end shutoff valve of one or more of the plurality of trap filters.

2. The manifold assembly of claim 1, wherein the housing further comprises a rotating structure for aligning the plurality of trap filters with the inlet to receive gas effluents from the semiconductor processing tool.

3. The manifold assembly of claim 2, further comprising positioning the manifold assembly on an exhaust line for the semiconductor processing tool upstream from a pump or abatement system.

4. The manifold assembly of claim 1, further comprising the plurality of trap filters being connected in parallel to receive the flow of gas effluent.

5. The manifold assembly of claim 1, wherein the plurality of trap filters further comprises at least two filtering materials for removing particulate and/or chemical contaminants.

6. The manifold assembly of claim 5, wherein one of the two filtering materials comprise a support material and a metal oxide adsorbent.

7. A method comprising:
   configuring a manifold assembly for a trap filter system to remove contaminants from gas effluent provided from an exhaust line of a semiconductor processing tool, the manifold assembly comprising:
   a plurality of trap filters connected to an inlet for receiving a flow of gas effluent containing contaminants generated by a semiconductor processing tool, wherein the plurality of trap filters are interchangeable while the semiconductor processing tool remains in operation;
   a housing for the plurality of trap filters; and
   a bypass mechanism configured to selectively direct or shut off the flow of gas effluent containing contaminants generated by the semiconductor processing tool to one or more of the plurality of trap filters; and
   activating the bypass mechanism to shut off the flow of gas effluent containing contaminants generated by the semiconductor processing tool to one or more of the plurality of trap filters and direct the flow of gas effluent containing contaminants generated by the semiconductor processing tool to another of the plurality of trap filters;
   wherein the bypass mechanism further comprises a front-end bypass mechanism and a back-end bypass mechanism;
   wherein each of the plurality of trap filters comprises a fore line shutoff valve, configured to receive the flow of gas effluent containing contaminants generated by the semiconductor processing tool, and a back-end shutoff valve, configured to output a flow of filtered gas effluent;

wherein the front-end bypass mechanism is located between the inlet of the manifold assembly and the fore line shutoff valve of each of the plurality of trap filters;

wherein the front-end bypass mechanism is configured to selectively shut off or divert the flow of gas effluent containing contaminants from the inlet of the manifold assembly to one or more of the plurality of trap filters; and wherein the back-end bypass mechanism is located downstream of the back-end shutoff valve of each of the plurality of trap filters and is configured to selectively shut off or divert the flow of filtered gas effluent to the back-end shutoff valve of one or more of the plurality of trap filters.

8. The method of claim 7, further comprising monitoring the flow of gas through the plurality of trap filters, wherein the monitoring determines when the plurality of trap filters need to be replaced.

9. The method of claim 7, further comprising removing and replacing the one or more of the plurality of trap filters.

10. The method of claim 7, further comprising removing particles, unreacted gases, reactive species, and corrosive gases from the gas effluents.

11. The method of claim 7, further comprising positioning the plurality of trap filters on the exhaust line for the semiconductor processing tool upstream from a pump or abatement system.

12. The method of claim 7, further comprising refurbishing or regenerating one or more of the plurality of trap filters for reuse.

13. A semiconductor processing system comprising:
a semiconductor processing tool, wherein the semiconductor processing tool generates exhaust gases with contaminants;
a manifold assembly for a trap filter system comprising:
an inlet for receiving a flow of exhaust gas effluent with contaminants generated by the semiconductor processing tool;
a plurality of filters, the plurality of filters having filtering materials to remove contaminants from the exhaust gases generated by the semiconductor processing tool, wherein the exhaust gases flow into at least one of the plurality of filters;
wherein the plurality of filters are interchangeable while the semiconductor processing tool remains in operation; and
a bypass mechanism configured to selectively direct or shut off the flow of exhaust gas effluent to one or more of the plurality of filters as the semiconductor processing tool remains in operation, wherein the bypass mechanism is activated to replace one or more of the plurality of filters;

wherein the bypass mechanism further comprises a front-end bypass mechanism and a back-end bypass mechanism;

wherein each of the plurality of filters comprises a fore line shutoff valve, configured to receive the flow of exhaust gas effluent with contaminants generated by the semiconductor processing tool, and a back-end shutoff valve, configured to output a flow of filtered exhaust gas effluent;

wherein the front-end bypass mechanism is located between the inlet of the manifold assembly and the fore line shutoff valve of each of the plurality of filters;

wherein the front-end bypass mechanism is configured to selectively shut off or divert the flow of exhaust gas effluent with contaminants from the inlet of the manifold assembly to one or more of the plurality of filters; and wherein the back-end bypass mechanism is located downstream of the back-end shutoff valve of each of the plurality of filters and is configured to selectively shut off or divert the flow of filtered exhaust gas effluent to the back-end shutoff valve of one or more of the plurality of filters.

14. The semiconductor processing system of claim 13, wherein the housing further comprises a rotating structure for aligning the filters with the inlet to receive gas effluents from the semiconductor processing tool.

15. The semiconductor processing system of claim 13, further comprising the plurality of filters being connected in parallel to receive the flow of the exhaust gas.

16. The semiconductor processing system of claim 13, wherein the plurality of filters remove particles, unreacted gases, reactive species, and corrosive gases from the exhaust gas.

17. The semiconductor processing system of claim 13, further comprising positioning the plurality of filters on the exhaust line for the semiconductor processing tool upstream from a pump or abatement system.

* * * * *